United States Patent
Liang et al.

(10) Patent No.: US 7,808,786 B2
(45) Date of Patent: Oct. 5, 2010

(54) CIRCUIT BOARD WITH COOLING FUNCTION

(75) Inventors: Chi-Hao Liang, Taipei Hsien (TW); Xie-Zhi Zhong, Taipei Hsien (TW); Hui-Ying Kuo, Taipei Hsien (TW)

(73) Assignee: Everlight Electronics Co., Ltd., Taipei Hsien (TW)

( * ) Notice: Subject to any disclaimer, the term of this patent is extended or adjusted under 35 U.S.C. 154(b) by 0 days.

(21) Appl. No.: 12/465,040

(22) Filed: May 13, 2009

(65) Prior Publication Data

US 2009/0219699 A1 Sep. 3, 2009

Related U.S. Application Data

(62) Division of application No. 11/598,643, filed on Nov. 14, 2006.

(30) Foreign Application Priority Data

Aug. 4, 2006 (TW) .............................. 95128685 A

(51) Int. Cl.
*H05K 7/20* (2006.01)

(52) U.S. Cl. ............... 361/704; 361/707; 361/719; 257/706; 362/294; 362/373; 165/80.3

(58) Field of Classification Search ............ 361/704, 361/719, 720, 760; 257/706, 712; 165/80.2, 165/80.3
See application file for complete search history.

(56) References Cited

U.S. PATENT DOCUMENTS 5,398,160 A * 3/1995 Umeda .................. 361/707
6,018,193 A * 1/2000 Rubens et al. .......... 257/720
6,428,189 B1 * 8/2002 Hochstein ............... 362/373
6,442,043 B1 * 8/2002 Seki et al. ............... 361/761
6,517,218 B2 * 2/2003 Hochstein ............... 362/294
6,518,502 B2 * 2/2003 Hammond et al. ...... 174/535
6,563,696 B1 * 5/2003 Harris et al. ............ 361/619
6,922,339 B2 * 7/2005 Nakamura et al. ...... 361/719
6,930,332 B2 * 8/2005 Hashimoto et al. ..... 257/98
6,999,318 B2 * 2/2006 Newby ................... 361/719
7,044,620 B2 * 5/2006 Van Duyn ............... 362/294
7,303,315 B2 * 12/2007 Ouderkirk et al. ...... 362/294
2007/0090737 A1 * 4/2007 Hu et al. ................. 313/11
2008/0198597 A1 * 8/2008 Blumel ................... 362/247

FOREIGN PATENT DOCUMENTS

| JP | 6-232549 | 8/1994 |
|---|---|---|
| JP | 6-334280 | 12/1994 |
| JP | 2529780 | 9/1996 |
| JP | 2783882 | 8/1998 |
| TW | 508063 | 10/2002 |
| TW | M248189 | 10/2004 |
| TW | I229577 | 3/2005 |

* cited by examiner

*Primary Examiner*—Boris L Chervinsky
(74) *Attorney, Agent, or Firm*—Rosenberg, Klein & Lee

(57) ABSTRACT

The manufacturing process of a circuit board includes forming a thermal interface layer on a first metal thin layer of a thermal plate. Joining a second metal layer of a main circuit board comprises at least one opening with the thermal interface layer. Then, reflowing the main circuit board with the joined thermal plate. A circuit board with a cooling function using the foregoing manufacturing process is also provided.

2 Claims, 2 Drawing Sheets

CIRCUIT BOARD WITH COOLING FUNCTION

RELATED APPLICATIONS

The present application is being filed as a Divisional of U.S. patent application Ser. No. 11/598,643, filed 14 Nov. 2006, currently pending, and is based on, and claims priority from, Taiwan Application Serial Number 95128685, filed Aug. 4, 2006, the disclosure of which is hereby incorporated by reference herein in its entirety.

BACKGROUND

1. Field of Invention

The present invention relates to the manufacturing process of a circuit board and a circuit board using the foregoing manufacturing process. More particularly, the present invention relates to the manufacturing process of a circuit board with a cooling function and a circuit board with a cooling function using the foregoing manufacturing process.

2. Description of Related Art

The power density of the circuit board is one of the design issues facing electronics systems as they continue to decrease in size and increase in performance. Decreased size and increased performance requires packing more circuitry into a given volume of the circuit board. Further, the electronic components disposed on the circuit board generate heat during the operation; however, the electronic circuits can only operate effectively and safely over a prescribed temperature range.

Metal Core Printed Circuit board (MCPCB) is adopted to solve the foregoing heat dissipation problem of the circuit board during the operation. However, MCPCB requires a complicated manufacturing process and the thermal medium layers make the MCPCB more expensive.

For the foregoing reasons, there is a need for a simplified manufacturing process of a circuit with a cooling functionality and a circuit board with a cooling function using the foregoing manufacturing process.

SUMMARY

It is therefore an aspect of the present invention to provide a manufacturing process of a circuit board with a cooling function to simplify the manufacturing of the circuit board.

It is another aspect of the present invention to provide a circuit board with a cooling function that cuts down the layers of thermal interfaces required to increase the speed of the heat transmission.

In accordance with the foregoing and other aspects of the present invention, a manufacturing process of a circuit board with a cooling function includes forming a thermally conductive interface layer on a first metal thin layer of a thermal plate; joining a second metal thin layer of a main circuit board comprising at least one opening with the thermally conductive interface layer; and reflowing the main circuit board with the joined thermal plate.

In accordance with the foregoing and other aspects of the present invention, a manufacturing process of a circuit board with a cooling function includes forming a thermally conductive interface layer on a thermal plate; joining a main circuit board comprises at least one opening together with the thermally conductive interface layer; and combining the thermal plate with the main circuit board.

In accordance with the foregoing and other aspects of the present invention, a circuit board with a cooling function includes a thermal plate, a main circuit board, and a thermally conductive interface layer. The thermally conductive interface layer is disposed between the thermal plate and the main circuit board, and is capable of combining the thermal plate with the main circuit board. The main circuit board further includes at least one opening disposed on the main circuit board, and is capable of disposing at least one electronic component. Wherein the electronic component is disposed on the opening, and heat generated by the electronic component is transmitted through the opening via the thermally conductive interface layer to the thermal plate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
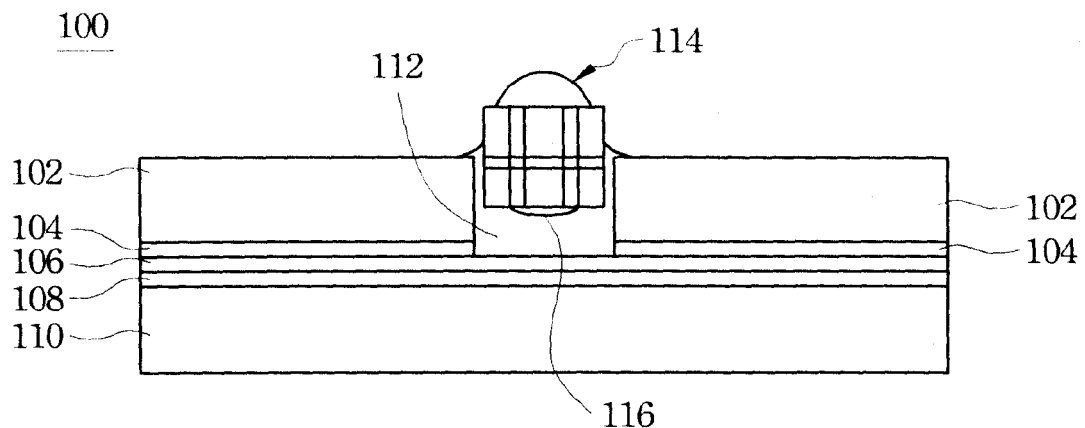
FIG. 1 is a cross-sectional view of the electronic components disposed on the circuit board with a cooling function according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

First Embodiment

FIG. 1 is a cross-sectional view of the electronic component disposes on the circuit board with a cooling function according to one embodiment of the present invention.

The circuit board 100 includes a thermal plate 110, a first metal thin layer 108, a thermally conductive interface layer 106, a second metal thin layer 104, and a main circuit board 102. The main circuit board 102 further includes at least one opening 112. The first metal thin layer 108 is disposed on the thermal plate 110, and the thermally conductive interface layer 106 is disposed on the first metal thin layer 108. The second metal thin layer 104 is disposed between the main circuit board 102 and the thermally conductive interface layer 106. For example, the second metal thin layer 104 is overlaid on the main circuit board 102 and avoids the opening 112, or the second metal thin layer 104 is completely overlaid on the thermally conductive interface layer 106, or thermally conductive interface layer 106 is overlaid on the first metal thin layer 108 and avoids the opening 112, or the thermally conductive interface layer 106 is completely overlaid on the first metal thin layer 108. The thermally conductive interface layer 106 may be a soldering paste, and the first metal thin layer 108 may be an electrically conductive material, for example, copper, silver, aluminum, tin, nickel, and lead. The second metal thin layer 104 may be an electrically conductive material, for example, copper, silver, aluminum, tin, nickel, and lead.

The size of the opening 112 of the main circuit board 102 is equal to or larger than a corresponding electronic component 114 to transmit heat generated by the electronic component 114 through the opening to the thermal plate 110 (for example, via the thermally conductive interface layer 106, the first metal thin layer 108, and then to the thermal plate 110; or directly from the first metal thin layer 108 to the thermal plate 110). The electronic component 114 has a heat conduction piece 116 disposed under the electronic component 114 and in the opening 112. The heat conduction piece 116 may directly contact the thermally conductive interface layer 106, or via the heat medium, for example, the air, to transmit the heat to the thermally conductive interface layer 106.

Figure 2:
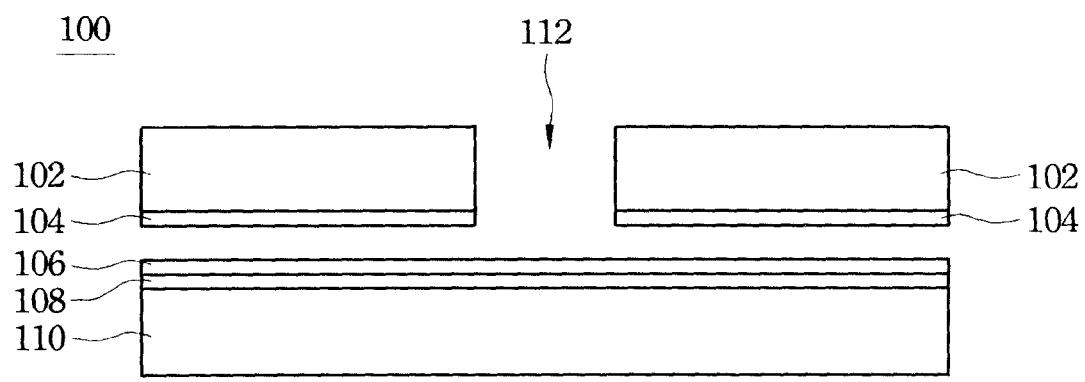
FIG. 2 and FIG. 3 are the manufacturing processes of a circuit board with a cooling function according to one embodiment of the present invention.
Figure 3:
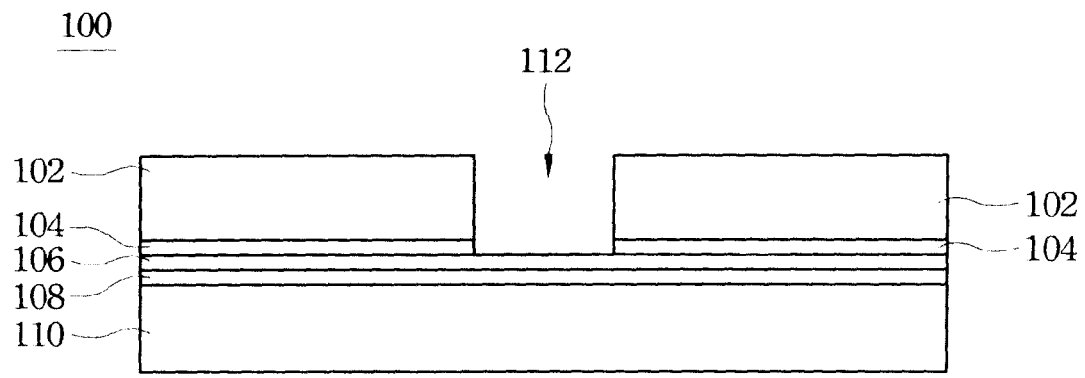

FIG. 2 and FIG. 3 show the manufacturing processes of a circuit board with a cooling function according to one embodiment of the present invention. A first metal thin layer 108 is formed on a thermal plate 110. For example, electroplating forms the first metal thin layer 108 on the thermal plate 110. The material used to form the first metal thin layer 108 is selected from the group consisting of copper, silver, aluminum, tin, nickel, and lead. For example, conventional copper foil, silver foil, aluminum foil, tin foil, nickel foil, or lead foil is attached on a surface of the thermal plate 110 to form the first metal thin layer 108.

Then, heat conduction material is applied on the first metal thin layer 108 to form a thermally conductive interface layer 106. The first metal thin layer 108 and the thermally conductive interface layer 106 are formed using the compatible materials, and the thermally conductive interface layer 106 is an electrically conductive material. For example, soldering paste is used to form the thermally conductive interface layer 106, and the material of the first metal thin layer 108 is compatible with the soldering paste, for example, the first metal thin layer is selected from the group consisting of copper, silver, aluminum, tin, nickel, and lead.

Please refer to FIG. 2, the main circuit board 102 further includes one opening 112, and a second metal thin layer 104 is formed on a surface of the main circuit board 102. Then, the second metal thin layer 104 of the main circuit board 102 is combined with the thermally conductive interface layer 106 of the thermal plate 106. The second metal thin layer 104 and the thermally conductive interface layer 106 are formed using the compatible materials, and the second metal thin layer 104 is selected from the group consisting of copper, silver, aluminum, tin, nickel, and lead. For example, the conventional copper foil, silver foil, aluminum foil, tin foil, nickel foil, or lead foil is attached on the surface of the main circuit board 102 to form the second metal thin layer 104. The second thin metal layer 104 is formed by applying a second metal material on the surface of the main circuit board 102 and avoids the opening 112, or the second metal thin layer 104 is formed by applying the second metal material completely on a surface of the main circuit board 102, or applying heat conductive material that avoids the opening 112 on the second metal thin layer 104 to form the thermally conductive interface layer 106, or by applying heat conductive material completely on the second metal thin layer 104 to form the thermally conductive interface layer 106.

Refer to FIG. 3, after combining the second metal thin layer 104 of the main circuit board 102 with the thermally conductive interface layer 106, then using reflowing to combine the first metal thin layer 108, the thermally conductive interface layer 106, the second metal thin layer 104, the thermal plate 110, and the main circuit board 102.

In the process of making the circuit board 100, an electronic component 114 may be disposed on the opening 112 of the main circuit board 102 shown in FIG. 1. The size of the opening 112 of the main circuit board 102 is equal to or larger than the corresponding electronic component 114. For example, heat generated by the electronic component 114 is transmitted via the thermally conductive interface layer 106 and the first metal thin layer 108 to the thermal plate 110, or directly transmit via the first metal thin layer 108 to the thermal plate 110. The electronic component 114 further includes a heat conduction piece 116, and is disposed under the electronic component 114 in the opening 112. For example, the heat conduction piece 116 directly contact the thermally conductive interface layer 106 to transmit the heat to the thermal interface layer thermally conductive interface layer 106, or the heat conduction piece 116 is indirect contact with the thermally conductive interface layer 106 to indirectly transmit the heat (for example, transmit via the heat medium, the air) to the thermally conductive interface layer 106. The thermally conductive interface layer 106 is formed on the second metal thin layer 104 and avoids the opening 112, and the heat conduction piece 116 directly contact the first metal thin layer 108 to transmit the heat to the thermal plate 110, or the heat conduction piece 116 is indirect contact with the first metal thin layer 108 to indirectly transmit the heat (for example, transmit via the heat medium, the air) to the thermal plate 110. The electronic component 114 may be a light emitting diode. For example, before the reflowing process, at least one electronic component 114 is disposed on the opening 112 of the main circuit board 102. Hence, the circuit board 100 has both a cooling function and an electronic component 114 disposed on the circuit board 100 during the reflowing process.

Second Embodiment

Figure 4:
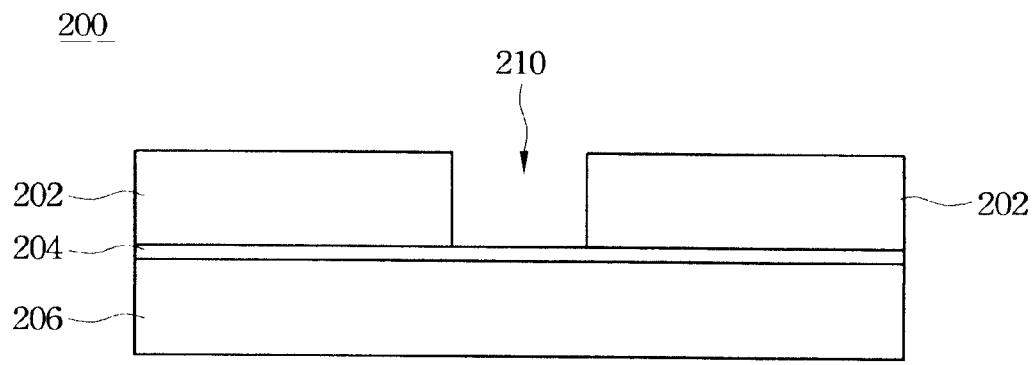
FIG. 4 is a cross-sectional view of a circuit board with a cooling function according to another embodiment of the present invention.

FIG. 4 is a cross-sectional view of a circuit board with a cooling function according to another embodiment of the present invention.

The circuit board 200 includes a thermal plate 206, a main circuit board 202 with at least one opening 210, and a thermally conductive interface layer 204. The thermally conductive interface layer 204 is disposed between the thermal plate 206 and the main circuit board 202 to combine the thermal plate 206 and the main circuit board 202. The thermally conductive interface layer 204 is completely overlaid on the thermal plate 206, or the thermally conductive interface layer 204 is overlaid on the thermal plate 206 and avoids the opening 210 (not shown). For example, the thermally conductive interface layer 204 is a colloid, and is disposed between the thermal plate 206 and the main circuit board 202.

Figure 5:
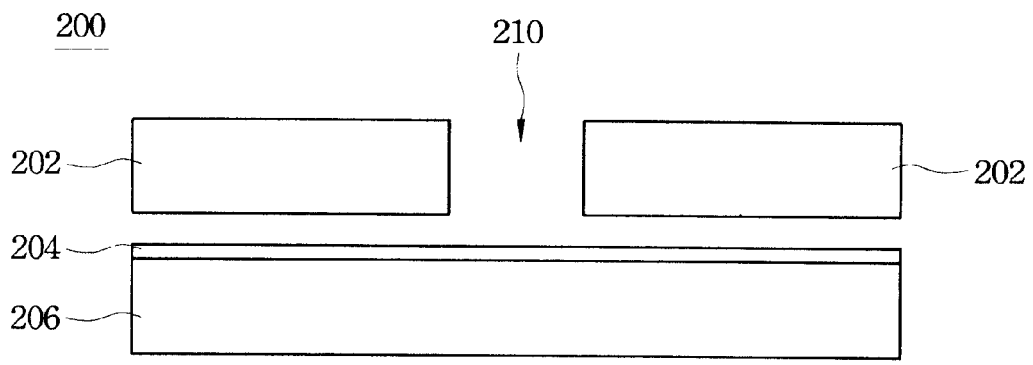
FIG. 5 and FIG. 6 are the manufacturing processes of a circuit board with a cooling function according to one embodiment of the present invention.
Figure 6:
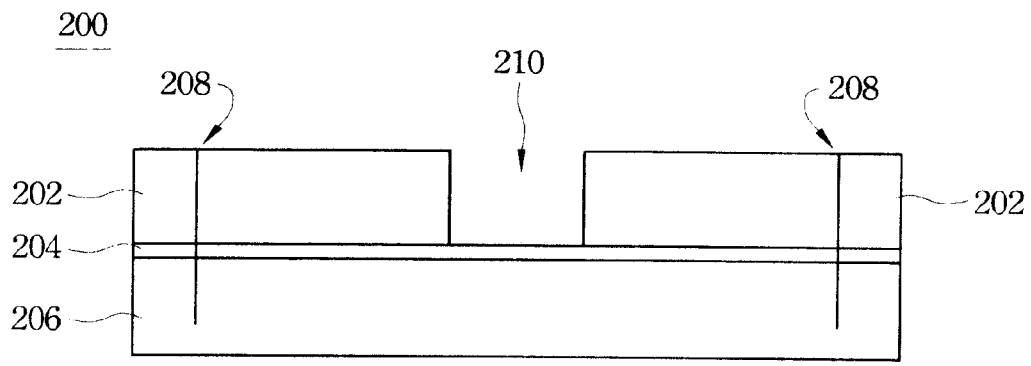

FIG. 5 and FIG. 6 are the manufacturing processes of a circuit board with a cooling function according to one embodiment of the present invention. Refer to FIG. 5. The thermally conductive interface layer 204 is formed on the thermal plate 206. For example, a colloid may be used to form the thermally conductive interface layer 204. The thermally conductive interface layer 204 is formed using an electrically conductive material, and the material of the thermally conductive interface layer 204 is selected from the group consisting of copper, silver, aluminum, tin, nickel, and lead. The thermally conductive interface layer 204 is formed by applying an electrically conductive material on the main circuit board 202 and avoids the opening 210, or by applying the electrically conductive material completely on the thermal plate 206 to form the thermally conductive interface layer 204. For example, electroplating forms the thermally conductive interface layer 204 on the thermal plate 206, or attaches the conventional copper foil, silver foil, aluminum foil, tin foil, nickel foil, or lead foil on a surface of the thermal plate 206 to form the thermally conductive interface layer 204.

Refer to FIG. 5. The main circuit board 202 has at least one opening 210. For example, heat generated by an electronic component (not shown) is transmitted by the thermally conductive interface layer 204 to the thermal plate 206, or directly transmitted to the thermal plate 206.

Refer to FIG. 6. The main circuit board 202 is combined with the thermally conductive interface layer 204 of the thermal plate 206 without the need of the colloid. For example, the main circuit board 202 further includes at least one locking element 208, to fix the thermal plate 206, the thermally conductive interface layer 204, and the main circuit board 202 together.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board with a cooling function, comprising:
a thermal plate;
a main circuit board comprising at least one opening therein for accommodating at least one electronic component;
a thermally conductive interface layer disposed between the thermal plate and the main circuit board for combining the thermal plate and the main circuit board;
a first thin metal layer disposed between the thermal plate and the thermally conductive interface layer; and
a second thin metal layer disposed between the main circuit board and the thermally conductive interface layer,
wherein the electronic component is positioned within the opening, and heat generated by the electronic component is transmitted to the thermal plate through the thermally conductive interface layer.

2. The circuit board with a cooling function of claim 1, wherein the thermally conductive interface layer comprises a solder paste.

* * * * *